(12) United States Patent
Hammerschmidt et al.

(10) Patent No.: US 10,732,007 B2
(45) Date of Patent: *Aug. 4, 2020

(54) LOW NOISE ZERO CROSSING DETECTION FOR INDIRECT TIRE PRESSURE MONITORING

(71) Applicant: Infineon Technologies AG, Neubiberg (DE)

(72) Inventors: Dirk Hammerschmidt, Villach (AT); Muhammad Adnan, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/298,563

(22) Filed: Mar. 11, 2019

(65) Prior Publication Data

US 2019/0204115 A1 Jul. 4, 2019

Related U.S. Application Data

(63) Continuation of application No. 14/665,608, filed on Mar. 23, 2015, now Pat. No. 10,254,129.

(60) Provisional application No. 62/126,214, filed on Feb. 27, 2015.

(51) Int. Cl.
| | |
|---|---|
| *G01D 5/12* | (2006.01) |
| *G01R 19/175* | (2006.01) |
| *G01R 13/02* | (2006.01) |
| *G01R 19/25* | (2006.01) |
| *G01R 23/00* | (2006.01) |
| *G01R 23/02* | (2006.01) |
| *G01P 3/487* | (2006.01) |

(Continued)

(52) U.S. Cl.
CPC ............... *G01D 5/12* (2013.01); *G01P 3/487* (2013.01); *G01P 3/488* (2013.01); *G01P 3/489* (2013.01); *G01R 19/175* (2013.01); *G01R 13/0254* (2013.01); *G01R 23/02* (2013.01)

(58) Field of Classification Search
CPC . G01D 5/12; G01P 3/487; G01P 3/488; G01P 3/489; G01R 19/175; G01R 13/0265; G01R 23/02
USPC .......................................................... 702/66
See application file for complete search history.

(56) References Cited

U.S. PATENT DOCUMENTS

| | | |
|---|---|---|
| 6,449,743 B1 | 9/2002 | Hosokawa et al. |
| 7,362,149 B1 | 4/2008 | Cheah et al. |
| 8,094,405 B1 | 1/2012 | Ying et al. |

(Continued)

FOREIGN PATENT DOCUMENTS

| | | |
|---|---|---|
| DE | 19735313 A1 | 2/1999 |
| DE | 10234094 A1 | 2/2004 |

(Continued)

OTHER PUBLICATIONS

Adnan M., et al., "Comparative Analysis of Methods for Computing Pole Angle Offsets in Magnetic Pole Wheels Using ABS Sensor," Ph.D. Research in Microelectronics and Electronics (PRIME), 9th Conference, Jun. 27, 2013, 4 pages.

(Continued)

*Primary Examiner* — Ly D Pham
(74) *Attorney, Agent, or Firm* — Harrity & Harrity, LLP

(57) ABSTRACT

A magnetic speed sensor may comprise a digital component configured to estimate a zero crossing event based on a plurality of sensor signal samples. The digital component may output, to a control unit, a speed signal that is based on the estimated zero crossing event.

20 Claims, 10 Drawing Sheets

(51) Int. Cl.
*G01P 3/488* (2006.01)
*G01P 3/489* (2006.01)

(56) References Cited

U.S. PATENT DOCUMENTS

| | | | |
|---|---|---|---|
| 8,573,045 | B2 | 11/2013 | Gotschlich et al. |
| 8,669,787 | B2 | 3/2014 | O'Connell et al. |
| 2005/0258820 | A1 | 11/2005 | Forster et al. |
| 2009/0218401 | A1 | 9/2009 | Moran et al. |
| 2009/0273341 | A1 | 11/2009 | Hainz et al. |
| 2011/0054832 | A1 | 3/2011 | Wenzler et al. |
| 2012/0229128 | A1 | 9/2012 | Satz et al. |
| 2012/0229170 | A1 | 9/2012 | Scholder et al. |
| 2013/0332045 | A1 | 12/2013 | Uluyol et al. |
| 2014/0028354 | A1 | 1/2014 | Yao et al. |
| 2014/0172251 | A1 | 6/2014 | Championnet et al. |
| 2014/0195104 | A1 | 7/2014 | Hammerschmidt et al. |
| 2014/0201126 | A1 | 7/2014 | Zadeh et al. |
| 2014/0288883 | A1 | 9/2014 | Hammerschmidt et al. |
| 2014/0372006 | A1 | 12/2014 | Hammerschmidt et al. |
| 2015/0096362 | A1 | 4/2015 | Hammerschmidt et al. |
| 2016/0004585 | A1 | 1/2016 | Slama et al. |
| 2016/0252543 | A1 | 9/2016 | Hammerschmidt et al. |

FOREIGN PATENT DOCUMENTS

| | | |
|---|---|---|
| DE | 102004017191 A1 | 10/2005 |
| EP | 2693221 A1 | 2/2014 |

OTHER PUBLICATIONS

Basu B., et al., "Predictive Zero-Crossing Detection Algorithm by Time Localised Iterative Least-Square Technique," Power Electronics and Applications (EPE 2011), Proceedings of the 2011-14th European Conference, Sep. 1, 2011, 7 pages.

Gustaffson F., "Automotive Safety Systems," IEEE Signal Processing Magazine, Jul. 2009, 16 pages.

Haykin S., "Communication Systems, 4th Edition," John Wiley & Sons, Inc., 2001, 838 pages.

Hou W.S., et al., "The Application of an Improved Zero-Crossing-Detection Method in Ultrasonic Measurement," IEEE Instrumentation and Measurement Technology Conference, May 21, 1998, 2 pages.

Kay S.M., Fundamentals of Statistical Signal Processing: Estimation Theory, University of Rhode Island, 1998, 6 pges.

Vainio O., et al., "Noise Reduction in Zero Crossing Detection by Predictive Digital Filtering," IEEE Transactions on Industrial Electronics, Feb. 1995, vol. 42(1), 5 pages.

Wall, "Simple Methods for Detecting Zero Crossing," http://Iwww.ece.uidaho.edu/ee/classes/ECE482-F03/Simple%20Methods.pdf, Feb. 3, 2012, 5 pages.

Zhang L., et al., "A Novel Demodulation Method based on Zero-Crossing Detection for UWB Signal Reception," Wireless Communications, Networking and Mobile Computing, WiCom '09. 5th International Conference, Sep. 26, 2009, 4 pages.

Zhang M., et al., "A Novel Zero-crossing Edge Detection Method Based on Multi-scale Space Theory," Signal Processing (ICSP), 2010 IEEE 10th International Conference, Oct. 28, 2010, 4 pages.

LOW NOISE ZERO CROSSING DETECTION FOR INDIRECT TIRE PRESSURE MONITORING

RELATED APPLICATION

This application is a continuation of U.S. patent application Ser. No. 14/665,608, filed Mar. 23, 2015, which claims priority under 35 U.S.C. § 119 to U.S. Provisional Patent Application No. 62/126,214, filed on Feb. 27, 2015, the content contents of which are incorporated by reference herein.

BACKGROUND

A tire pressure monitoring system (TPMS) may be implemented as a direct TPMS or an indirect TPMS (ITPMS). A direct TPMS may employ a pressure sensor mounted in and/or on a tire to physically measure tire pressure of the tire. ITPMS may not use a physical pressure sensor, but may instead indirectly measure tire pressure by monitoring another available signal, such as a rotational speed of a wheel.

SUMMARY

According to some possible implementations, a magnetic speed sensor may comprise a digital component configured to: estimate a zero crossing event based on a plurality of sensor signal samples; and output, to a control unit, a speed signal that is based on the estimated zero crossing event.

According to some possible implementations a system may comprise a sensor module configured to: estimate a zero crossing event based on a group of sensor signal samples, where the group of sensor signal samples may include a sensor signal sample with a value above a signal threshold, and a sensor signal sample with a value below the signal threshold; and provide, to a control unit, a speed signal that is based on the estimated zero crossing event.

According to some possible implementations, a method may comprise: identifying, by a digital component of a magnetic sensor, a zero crossing event based on a plurality of sensor signal samples; and outputting, by the digital component of the magnetic sensor, a signal that is based on the identified zero crossing event.

DETAILED DESCRIPTION

Figure 1A:
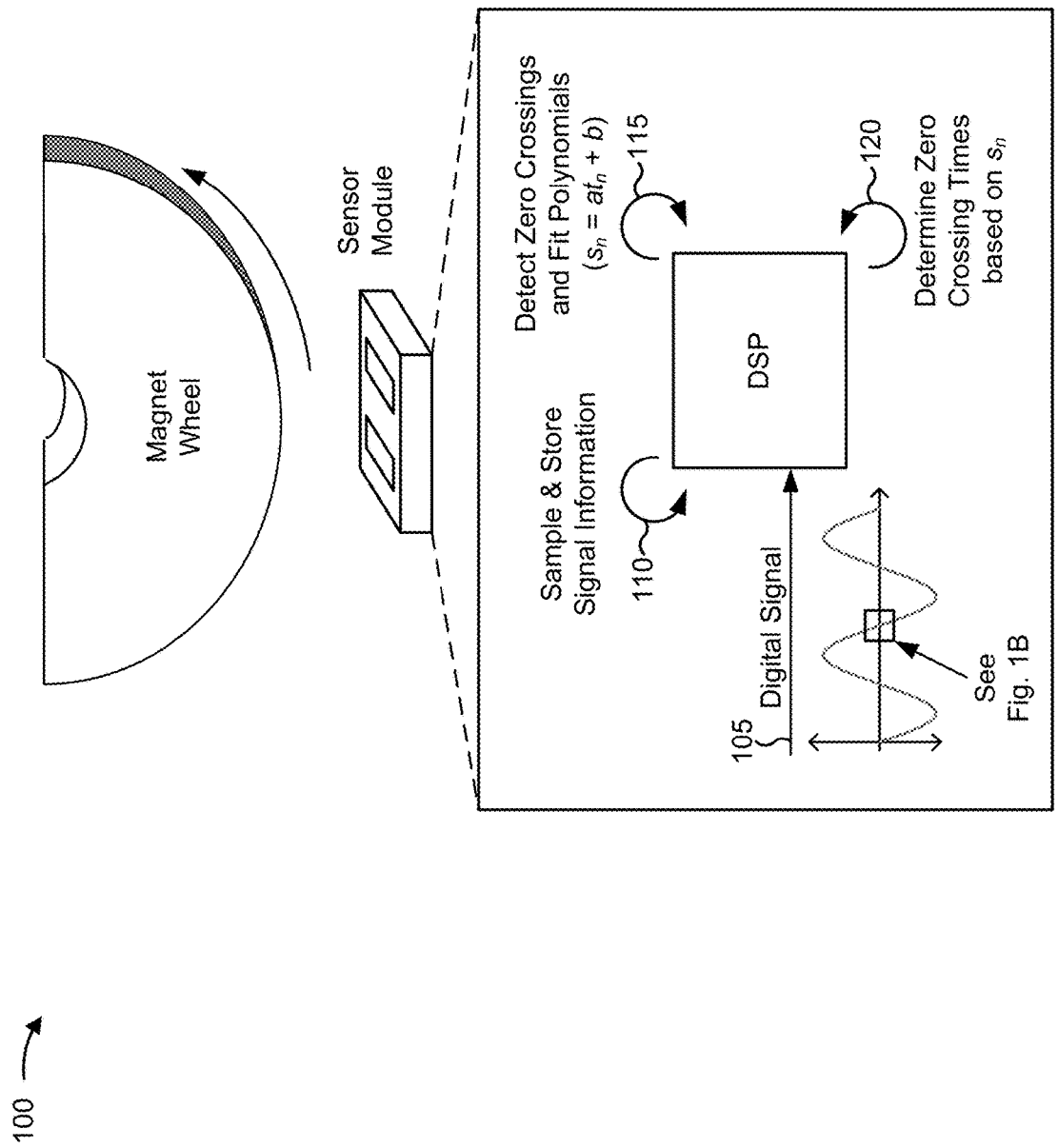
FIGS. 1A and 1B are diagrams of an overview of an example implementation described herein.

The following detailed description of example implementations refers to the accompanying drawings. The same reference numbers in different drawings may identify the same or similar elements.

Magnet wheels, in conjunction with sensors (e.g., magnetoresistance (MR) sensors, Hall effect sensors, variable reluctance sensors, fluxgate sensors, anti-lock braking system (ABS) sensors, etc.), are widely use in automotive and mechanical applications in order to determine a speed signal used for calculating a speed of a rotating part (e.g., a wheel, a shaft, etc.). A spectrum analysis of the speed signal may also provide insight into other useful information, such as information associated with vibrations present in the rotating part. This analysis may be a basis for another application, such as ITPMS, where indirect measurement of tire pressure (e.g., based on vibration information associated with the rotating part) may result in cost savings by not requiring another sensor to be included in the system. However, for use in an ITPMS, preservation of accurate zero crossing instants, within the signal generated by the sensor, may be needed in order to identify zero crossing timestamps needed to generate a low noise speed signal necessary for an ITPMS.

A traditional ABS sensor may use an analog comparator to switch (e.g., depending on changes in the magnetic field as compared to a threshold) between two pulses, such as a positive pulse and a negative pulse, in order to represent zero crossings associated with a sensed magnetic field. A timer may then calculate a duty cycle of the pulses, and the speed signal may be computed accordingly. However, due to noise in the comparator and/or variations in the threshold, the speed signal may have a high noise floor when analyzed in a frequency domain. Consequently, vibration information may be buried in the noise floor and hence become indistinguishable. This problem may be alleviated by using digital signal processing techniques that achieve a lower noise floor in the speed spectrum. In some implementations, a magnetoresistance (MR) sensor (e.g., a giant magnetoresistance (GMR) sensor, a colossal magnetoresistance (CMR) sensor, an anisotropic magnetoresistance (AMR) sensor, a tunnel magnetoresistance (TMR) sensor, an extraordinary magnetoresistance (EMR) sensor, etc.) may be used to generate a higher quality speed signal (e.g., a speed signal with a low noise floor). Additionally, or alternatively, another type of magnetic field sensor may be used, such as a Hall effect sensor, a variable reluctance sensor (VRS), a fluxgate sensor, or the like.

Implementations described herein may allow a digital signal processor to determine zero crossing times, associated with a digital signal corresponding to a magnetic field, based on fitting a polynomial at the zero crossing. The zero crossing times may then be used to determine a speed spectrum with a low noise floor that allows other useful information (e.g., vibration information) to be identified and/or further analyzed (e.g., for use in an ITPMS).

Figure 1B:
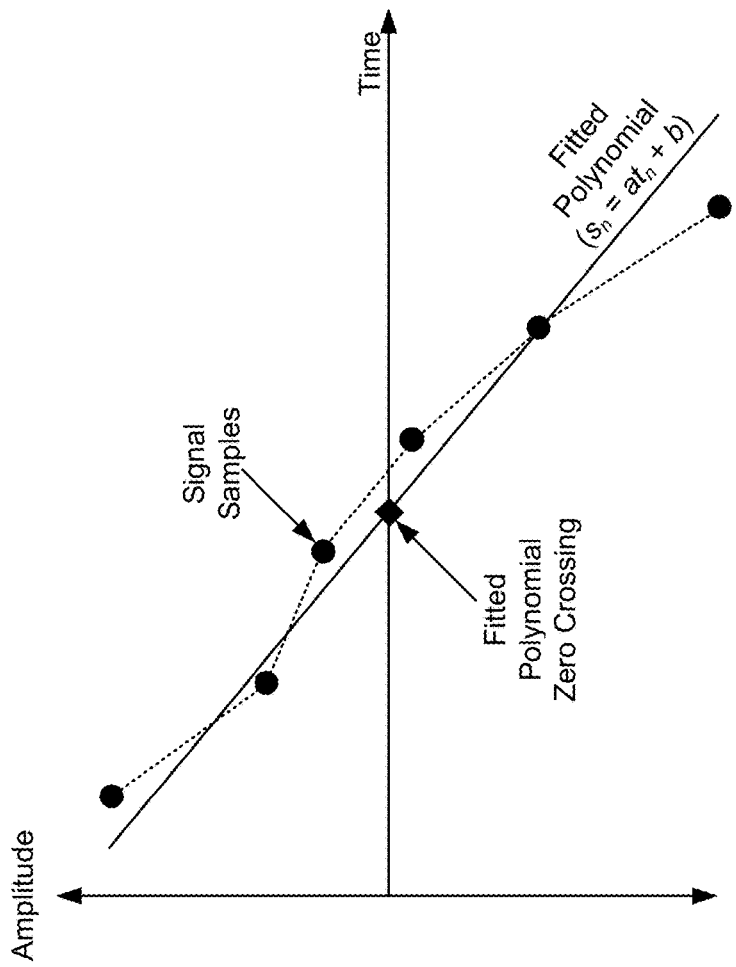

FIGS. 1A and 1B are diagrams of an overview of an example implementation 100 described herein. For the purposes of example implementation 100, assume that a sensor module is positioned such that an MR sensor, included in the sensor module, may detect a magnetic field generated by a rotating magnet wheel. Further, assume that the sensor module is capable of converting an analog signal (e.g., generated based on the magnetic field) to a digital signal, and that the sensor module includes a digital signal processor (DSP).

As shown in FIG. 1A, and by reference number 105, the DSP may receive the digital signal that corresponds to the magnetic field sensed by the MR sensor. As shown by reference number 110, the DSP may sample the signal in order to determine signal information, associated with the signal, and may store the signal information. For example, the DSP may store, in a buffer memory, sampled signal information that includes a set of signal amplitudes and a corresponding set of timestamps.

As shown by reference number 115, the DSP may detect, based on sampling the signal information, zero crossings within the digital signal. For example, the DSP may detect a zero crossing when a first signal amplitude (e.g., corresponding to a first timestamp) is a positive value, and a second signal amplitude (e.g., corresponding to a second timestamp successive to the first timestamp) is a negative value. As further shown, the DSP may then determine signal information associated with the zero crossing (e.g., signal information that includes a set signal amplitudes and corresponding timestamps received immediately before the zero crossing and a set signal amplitudes and corresponding timestamps received immediately after the zero crossing), and may determine a fitted polynomial (e.g., a first order polynomial in the form of $s_n=at_n+b$) based on the signal information. As shown by reference number 120, the DSP may then determine a zero crossing time based on the fitted polynomial. FIG. 1B shows a diagram of an example fitted polynomial determined by the DSP. The DSP may determine multiple zero crossing times (e.g., for subsequent zero crossings) in a similar manner.

In some implementations, the DSP may store and/or provide information associated with the zero crossing times for further analysis. For example, zero crossing times, generated in the above manner, may be used to generate a low noise speed spectrum that allows useful information (e.g., vibration information) to be identified and/or further analyzed (e.g., for use in an ITPMS). In this way, a digital signal processor may determine accurate zero crossing times, associated with a digital signal corresponding to a magnetic field, based on fitting a polynomial at the zero crossing.

Figure 2:
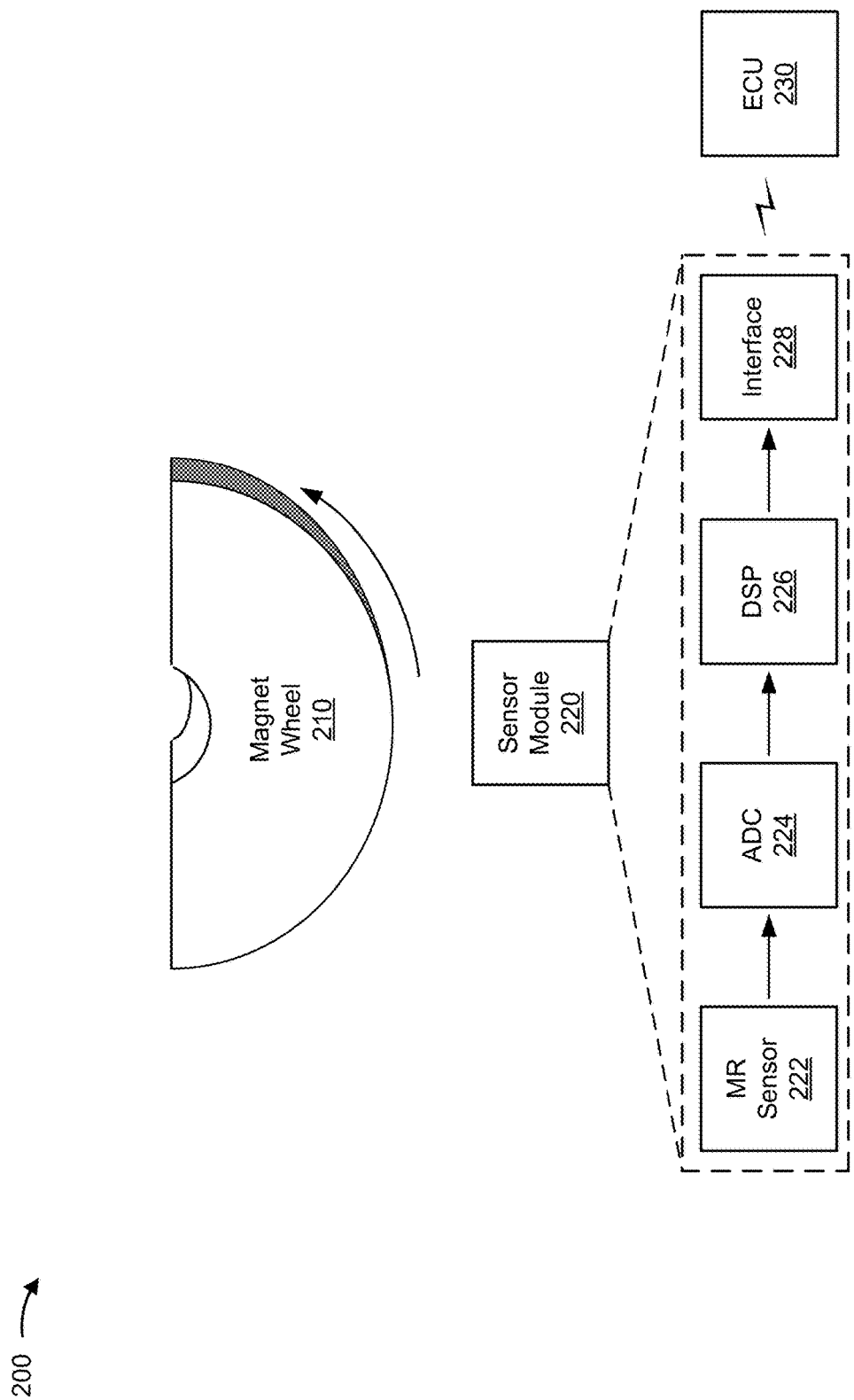
FIG. 2 is a diagram of an example environment in which systems and/or methods, described herein, may be implemented.

FIG. 2 is a diagram of an example environment 200 in which systems and/or methods, described herein, may be implemented. As shown in FIG. 2, environment 200 may include a magnet wheel 210, a sensor module 220, and an electronic control unit (ECU) 230. As shown, sensor module 220 may include a MR sensor 222, an analog to digital converter (ADC) 224, a DSP 226, and an interface component 228.

Magnet wheel 210 may include one or more magnets. In some implementations, magnet wheel 210 may include a magnetic pole wheel (e.g., with at least two alternating poles, such as a north pole and a south pole), a tooth wheel (e.g., a wheel that deflects a magnetic field of a backbias magnet associated with a sensor), a dipole magnet (e.g., a dipole bar magnet, a circular dipole magnet, an elliptical dipole magnet, etc.), a permanent magnet, an electromagnet, a magnetic scale, a magnetic tape, or the like. Magnet wheel 210 may be comprised of a ferromagnetic material, and may produce a magnetic field. In some implementations, magnet wheel 210 may be attached to or coupled with an object for which a speed is to be measured, such as wheel structure (e.g., associated with a tire), an axle (e.g., a vehicle axle), a cylindrical structure (e.g., a rotating cylinder, a camshaft, a crankshaft, etc.), or the like.

Sensor module 220 may include a housing associated with one or more components of a sensor, such as a MR sensor, a Hall effect sensor, a VRS, a fluxgate sensor, or the like. While implementations described herein are described in the context of using a MR sensor, in some implementations, another type of sensor may be used (e.g., a Hall effect sensor, a VRS, a fluxgate sensor, etc.). In some implementations, sensor module 220 may be connected to ECU 230 such that sensor module 220 may transmit information to ECU 230.

MR sensor 222 may include one or more apparatuses for measuring magnetoresistance. For example, MR sensor 222 may be comprised of a magnetoresistive material, such as nickel iron (NiFe). The electrical resistance of the magnetoresistive material may depend on a strength and/or a direction of an external magnetic field applied to the magnetoresistive material, such as a magnetic field generated by magnet wheel 210. MR sensor 222 may measure magnetoresistance using anisotropic magnetoresistance (AMR) technology, giant magnetoresistance (GMR) technology, tunnel magnetoresistance (TMR) technology, or the like. In some implementations, MR sensor 222 may provide an analog signal, corresponding to the external magnetic field, to ADC 224.

ADC 224 may include an analog-to-digital converter that converts an analog signal (e.g., a voltage signal), corresponding to a magnetic field detected by MR sensor 222, to a digital signal. ADC 224 may provide the digital signal to DSP 226 for processing.

DSP 226 may include a digital signal processing device or a collection of digital signal processing devices. DSP 226 is implemented in hardware, firmware, or a combination of hardware and software. In some implementations, DSP 226 may receive a digital signal from ADC 224 and may process the digital signal. In some implementations, DSP 226 may be capable of determining zero crossing times, associated with the digital signal, based on fitting polynomials at the zero crossings, as described below. Additional details regarding DSP 226 are described below with regard to FIG. 3.

Interface component 228 may include a component configured to receive information from and/or transmit information to DSP 226 and/or ECU 230. For example, interface component 228 may receive, from DSP 226, zero crossing information, speed spectrum information, vibration information, or the like, and may provide the received information to ECU 230.

ECU 230 may include a device associated with controlling one or more electrical systems and/or electrical subsystems, for example, one or more electrical systems and/or one electrical subsystems included in a motor vehicle (e.g., an electronic/engine control module (ECM), a powergain control module (PCM), a transmission control module (TCM), a brake control module (BCM or EBCM), a central control module (CCM), a central timing module (CTM), a general electronic module (GEM), a body control module (BCM), a suspension control module (SCM), etc.). In some implementations, ECU 230 may be connected to sensor module 220 (e.g., via interface 228) such that ECU 230 may receive information from and/or provide information to sensor module 220.

The number and arrangement of devices and/or components shown in FIG. 2 are provided as an example. In practice, there may be additional devices and/or components, fewer devices and/or components, different devices and/or components, or differently arranged devices and/or components than those shown in FIG. 2. Furthermore, two or more devices and/or components shown in FIG. 2 may be implemented within a single device and/or a single component, or a single device and/or a single component shown in FIG. 2 may be implemented as multiple, distributed devices and/or components. Additionally, or alternatively, a set of devices (e.g., one or more devices) and/or a set of components (e.g., one or more components) of environment 200 may perform one or more functions described as being performed by another set of devices and/or another set of components of environment 200.

Figure 3:
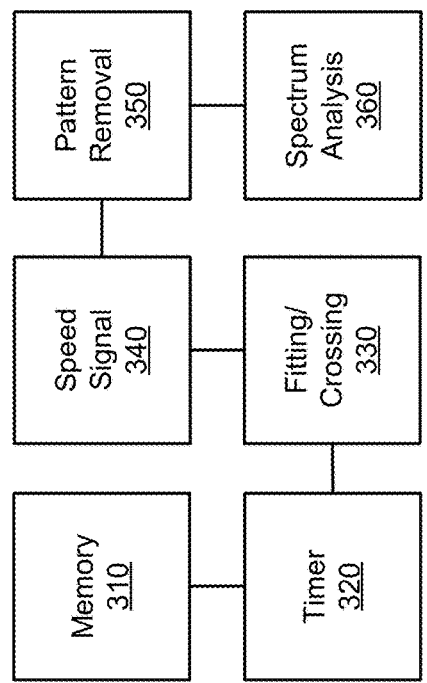
FIG. 3 is a diagram of example components of a digital signal processor shown in the example environment of FIG. 2.

FIG. 3 is a diagram of example components of DSP 226 shown in the example environment of FIG. 2. As shown in FIG. 3, DSP 226 may include a memory 310, a timer 320, a fitting/crossing component 330, a speed signal component 340, a pattern removal component 350, and a spectrum analysis component 360.

Memory 310 may include a component associated with buffering and/or storing signal information sampled by DSP 226. For example, memory 330 may include a random access memory (RAM) and/or another type of dynamic storage device. In some implementations, memory 310 may be configured to implement a constant buffer length technique (e.g., such that memory component 310 stores a particular quantity of signal amplitudes and corresponding timestamps). Additionally, or alternatively, memory 310 may be configured to implement a constant threshold level technique (e.g., such that the quantity of signal amplitudes and the corresponding timestamps varies based on the digital signal).

Timer 320 may include a component associated with determining and/or providing timing information associated with a zero crossing time of a digital signal. For example, timer 320 may include a counter configured to determine a timestamp corresponding to a signal amplitude of the digital signal.

Fitting/crossing component 330 may include a component configured to determine a fitted polynomial associated with a zero crossing of a digital signal, and determine a zero crossing time based on the fitted polynomial and/or signal information associated with the digital signal. In some implementations, fitting/crossing component 330 may obtain (e.g., from memory component 310) signal information associated with a zero crossing, and may determine, based on the signal information, a fitted polynomial associated with the crossing. Additionally, or alternatively, fitting/crossing component 330 may determine a zero crossing time based on the fitted polynomial. In some implementations, fitting/crossing component 330 may determine multiple zero crossing times associated with the digital signal. Additionally, or alternatively, fitting/crossing component 330 may provide and/or store information associated with multiple zero crossing times (e.g., for use in determining a speed signal based on the multiple zero crossing times).

Speed signal component 340 may include a component associated with determining a signal that represents a rotational speed. For example, speed signal component 340 may calculate, based on information associated with the zero crossing times determined by fitting/crossing component 330, a speed signal that represents a rotational speed of magnet wheel 210. In some implementations, the speed signal may be analyzed for use in a frequency domain (e.g., based on generating a speed spectrum corresponding to the speed signal).

Pattern removal component 350 may include a component associated with removing a pattern present in the speed signal determined by speed signal component 340. For example, magnet wheel 210 may include irregularities that introduce a pattern in the speed signal which may cause spectral tones to change frequency (e.g., depending on a driving speed). Such tones may mask, for example, vibration information included in the speed signal (e.g., since vibrations may have a small amount of signal energy). Here, pattern removal component 350 may reduce or remove the pattern from the speed signal.

Spectrum analysis component 360 may include a component configured to determine a speed spectrum based on the speed signal. In some implementations, spectrum analysis component 360 may include a component configured to compute (e.g., by performing a discrete Fourier transformation) a speed spectrum based on the speed signal. In some implementations, spectrum analysis component may be capable of analyzing the speed spectrum in order to identify vibration information (e.g., information that identifies a vibration frequency) based on the speed spectrum (e.g., for use in an ITPMS).

The number and arrangement of components shown in FIG. 3 are provided as an example. In practice, DSP 226 may include additional components, fewer components, different components, or differently arranged components than those shown in FIG. 3. Additionally, or alternatively, a set of components (e.g., one or more components) of DSP 226 may perform one or more functions described as being performed by another set of components of DSP 226 and/or another component of sensor module 220.

Figure 4:
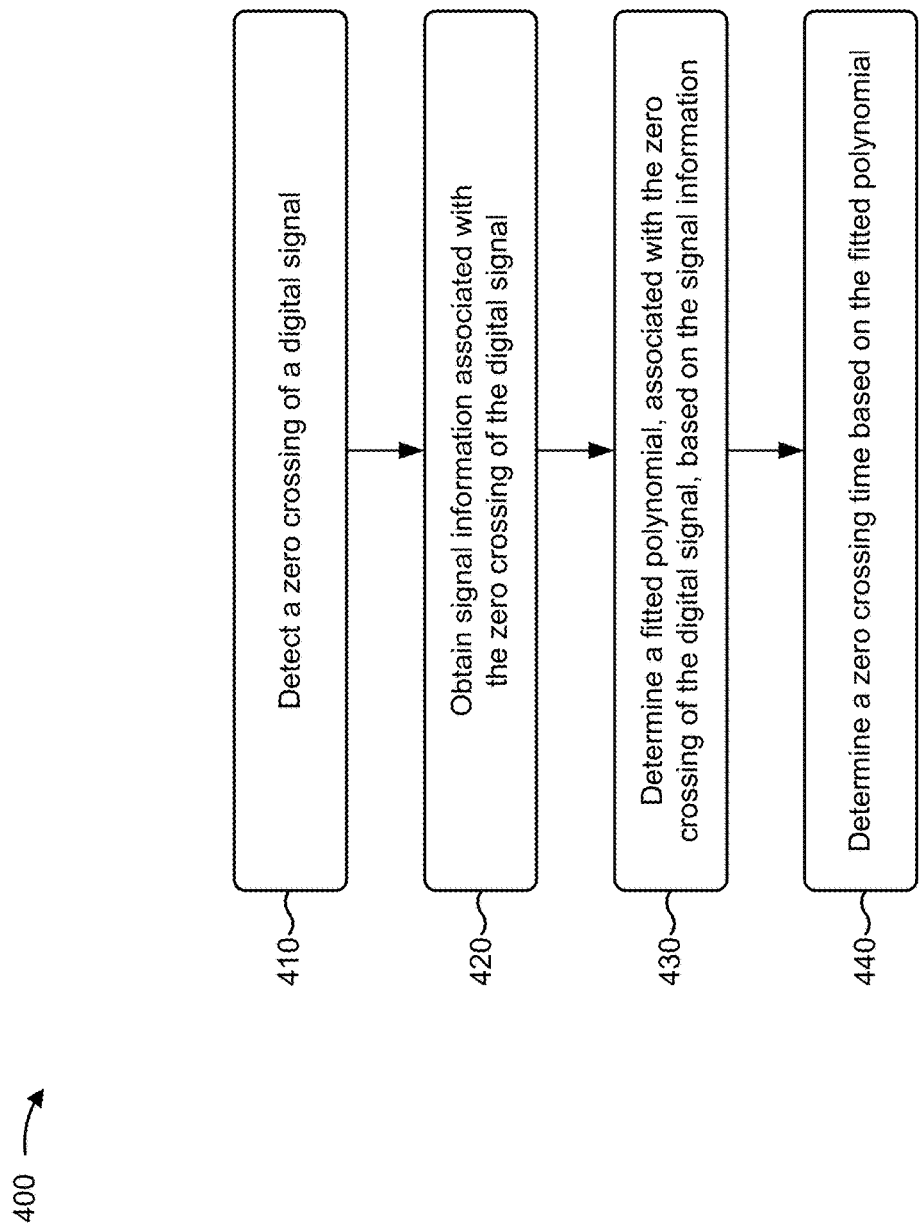
FIG. 4 is a flow chart of an example process for determining a zero crossing time, associated with a zero crossing of a digital signal, based on a fitted polynomial associated with the zero crossing of the digital signal.

FIG. 4 is a flow chart of an example process 400 for determining a zero crossing time, associated with a zero crossing of a digital signal, based on a fitted polynomial associated with the zero crossing of the digital signal. In some implementations, one or more process blocks of FIG. 4 may be performed by DSP 226. In some implementations, one or more process blocks of FIG. 4 may be performed by another device and/or component or a set of devices and/or a set of components separate from or including DSP 226, such by another component of sensor module 220 and/or ECU 230.

Figure 5A:
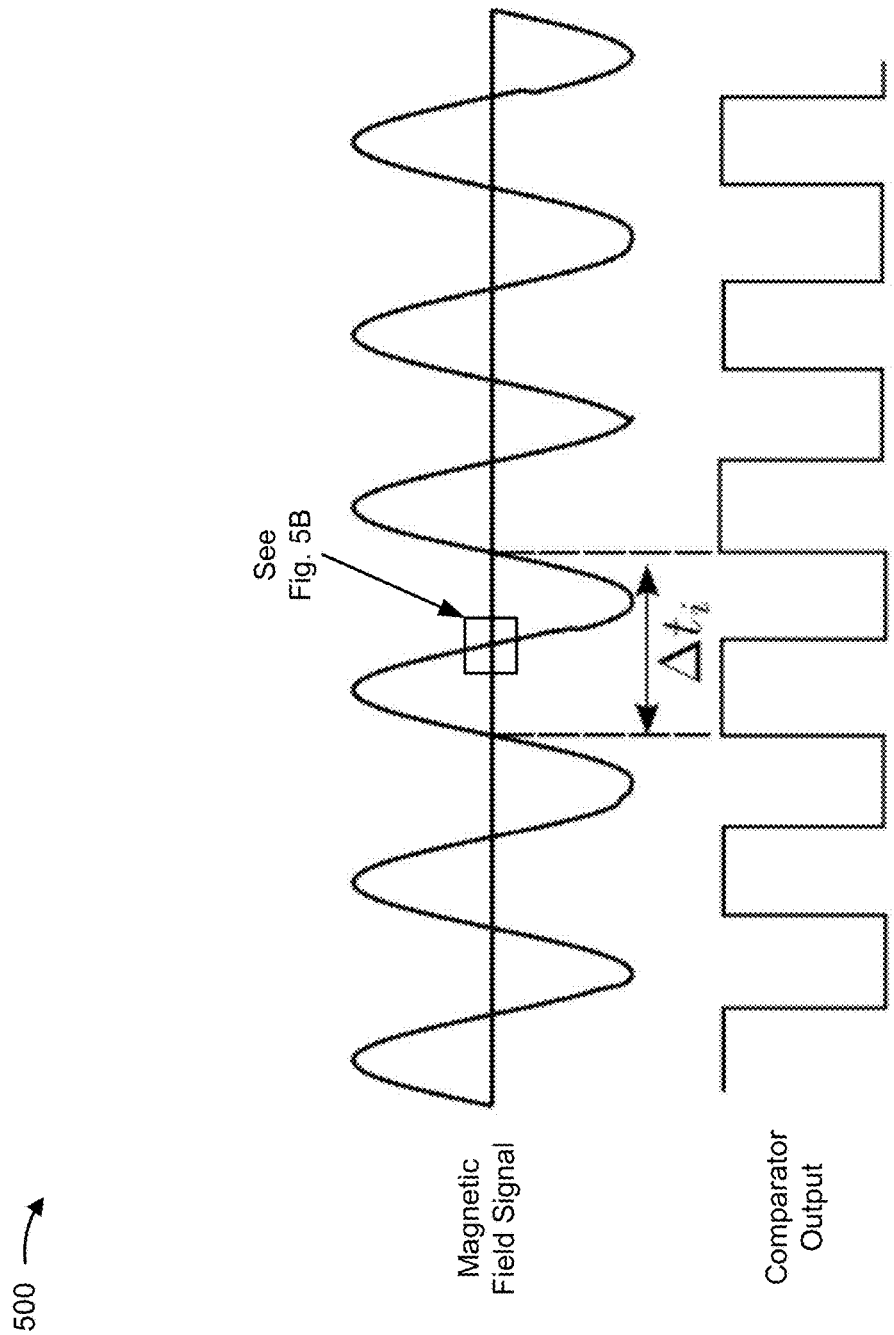
FIG. 5A is a diagram that shows an example output of a comparator that switches between two pulses based on a magnetic field signal.

In some implementations, DSP 226 may determine zero crossing times, associated with a digital signal, in order to determine a speed spectrum with a low noise floor. As described above, an ABS sensor may use an analog comparator to switch between two pulses (e.g., depending on changes in a magnetic field sensed by the ABS sensor) in order to represent zero crossings of a magnetic signal (e.g., in the form of a square pulse). The square pulse may then be used to determine rotational speed. FIG. 5A is a diagram that shows example output of a comparator that switches between two pulses based on a magnetic field signal. However, a disadvantage of ABS sensor signaling protocol (e.g., for use in an ITPMS system) lies in the reduction of information imposed by the comparator. In other words, since the comparator outputs only a sequence of pulses that identity times at which the magnetic field signal crosses a threshold (e.g., zero), other information included in the sinusoidal signal (e.g., that may be used for ITPMS processing) may be lost. Moreover, due to noise in the comparator, these zero crossing times may have a high noise floor when analyzed in a frequency domain. Consequently, vibration information may be buried in the noise floor and hence become indistinguishable.

Figure 5B:
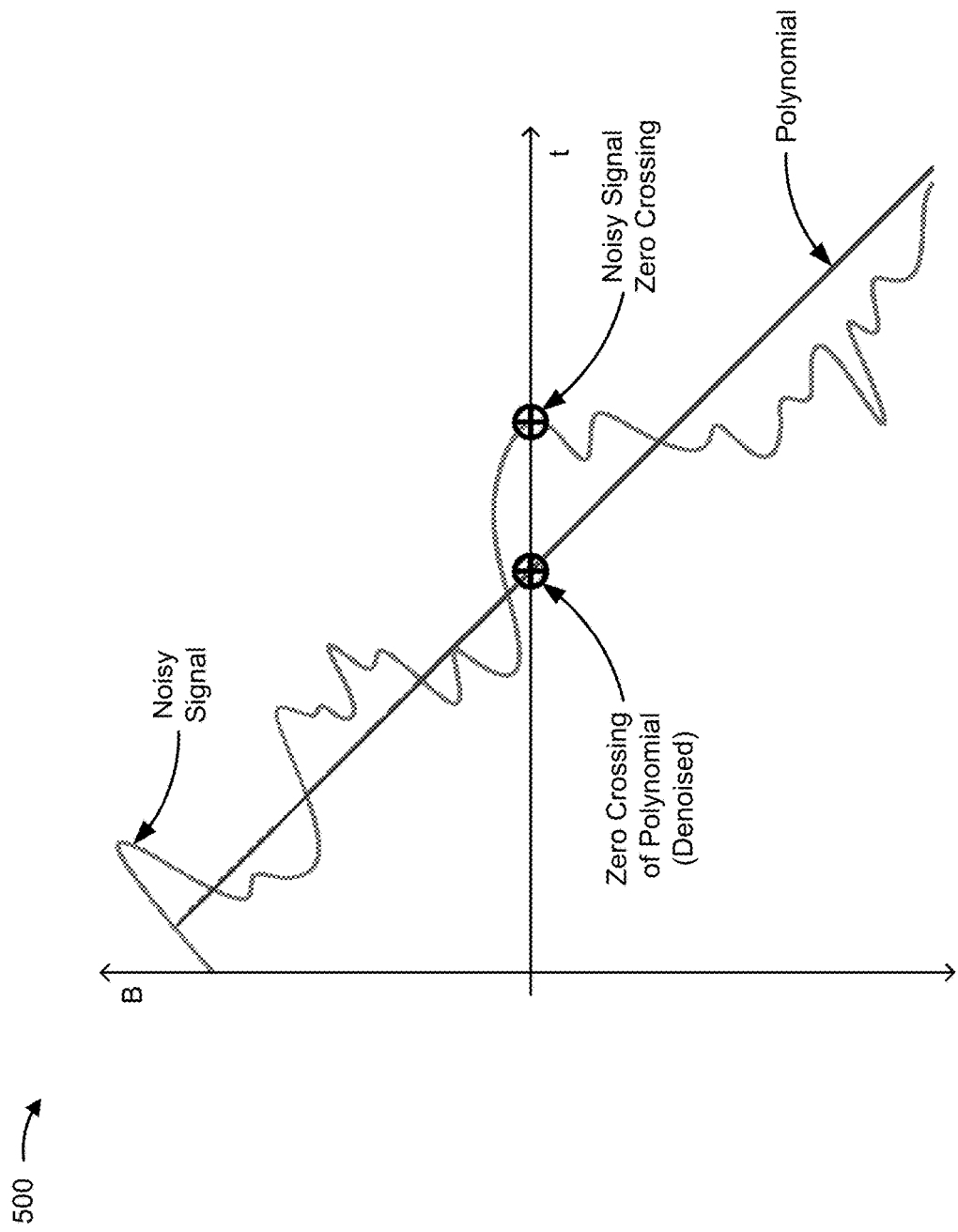
FIG. 5B is a diagram that shows an example of how a zero crossing, identified using a fitted polynomial, may compare to a zero crossing identified based on anti-lock braking system (ABS) sensor signaling protocol.

As described below, in order to determine accurate zero crossing times (e.g., for ITPMS processing), DSP 226 may obtain signal information around (e.g., immediately before and immediately after) a zero crossing of the magnetic signal, and may use the signal information to determine a fitted polynomial that may provide zero crossing information that is more accurate than that delivered by the ABS threshold comparison as described above. FIG. 5B is a diagram that shows an example of how a zero crossing, identified using a fitted polynomial, may compare to a zero crossing identified based on ABS sensor signaling protocol. As shown in FIG. 5B, the zero crossing time determined based on the fitted polynomial of a noisy signal may be a more accurate representation of the zero crossing than the zero crossing identified based on the noisy signal itself (e.g., using the ABS sensor signal protocol). As described below, such accurate zero crossing information may be used to determine a speed spectrum with a low noise floor that allows other useful information (e.g., vibration information) to be identified and/or further analyzed (e.g., for use in an ITPMS)

As shown in FIG. 4, process 400 may include detecting a zero crossing of a digital signal (block 410). For example, DSP 226 may detect a zero crossing of a digital signal. In some implementations, DSP 226 may detect the zero crossing of the digital signal based on sampling the digital signal, as described below.

In some implementations, DSP 226 may be configured to sample the digital signal (e.g., after analog to digital conversion), associated with the magnetic field sensed by MR sensor 222, in order to determine signal information associated with the digital signal. Signal information may include signal amplitudes, associated with the digital signal, and timestamps corresponding to the signal amplitudes. In some implementations, DSP 226 may be configured to sample the digital signal at a particular sampling rate. For example, DSP 226 may sample the digital signal at a sampling rate of 100 kilohertz (KHz).

In some implementations, DSP 226 may store the signal information determined based on sampling the digital signal. For example, DSP 226 may store the signal information in a buffer memory (e.g., memory component 310). In some implementations, DSP 226 may store a particular quantity of successive samples. For example, DSP 226 may be configured to store eight successive samples, sixteen successive samples, thirty-two successive samples, or the like. Here, DSP 226 may buffer (e.g., using a First In, First Out technique) the signal information in memory component 310.

In some implementations, DSP 226 may detect a zero crossing based on sampling the digital signal. For example, DSP 226 may detect a zero crossing when first signal information (e.g., a first signal amplitude and a corresponding first timestamp), associated with a first sample, includes a positive signal amplitude value (e.g., greater than zero), and second signal information (e.g., a second signal amplitude and a corresponding second timestamp immediately following the first timestamp), associated with a second sample, includes a negative amplitude value (e.g., less than zero). As another example, DSP 226 may detect a zero crossing when first signal information (e.g., a first signal amplitude and a corresponding first timestamp), associated with a first sample, includes a negative signal amplitude value (e.g., less than zero), and second signal information (e.g., a second signal amplitude and a corresponding second timestamp immediately following the first timestamp), associated with a second sample, includes a positive amplitude value (e.g., greater than zero). As yet another example, DSP 226 may detect a zero crossing when signal information (e.g., a signal amplitude and a corresponding timestamp), associated with a sample, includes a signal amplitude that is equal to zero.

As further shown in FIG. 4, process 400 may include obtaining signal information associated with the zero crossing of the digital signal (block 420). For example, DSP 226 may obtain signal information associated with the zero crossing. In some implementations, DSP 226 may obtain the signal information associated with the zero crossing after DSP 226 detects the zero crossing.

In some implementations, DSP 226 may obtain signal information that precedes the zero crossing from storage. Additionally, or alternatively, DSP 226 may sample the signal in order to obtain signal information that follows the zero crossing (e.g., for purposes of determining a fitted polynomial associated with the zero crossing). For example, in some implementations, DSP 226 may be configured to implement a constant buffer length technique. According to this technique, DSP 226 may sample and store signal information for a fixed quantity of samples (e.g., eight, samples, sixteen samples, thirty-two samples, etc.). Here, if DSP 226 detects a zero crossing between a most recent pair of samples (e.g., a pair of two most recent samples), then DSP 226 may continue sampling the digital signal after the zero crossing until DSP 226 stores (e.g., in a buffer memory) a first set of signal information that includes a quantity of samples taken before the zero crossing, and a second set of signal information that includes a quantity of samples taken after the zero crossing. As an example, if DSP 226 is configured to store, in a buffer memory, signal information for sixteen samples, then, after detecting a zero crossing, DSP 226 may continue sampling until DSP 226 stores eight samples taken before the zero crossing and eight samples taken after the zero crossing. DSP 226 may then obtain the signal information for the sixteen samples from the buffer memory. The signal information may then be used to determine a fitted polynomial associated with the zero crossing, as described below. The constant buffer technique may be useful when an amount of memory available to DSP 226 is limited.

As another example, in some implementations, DSP 226 may be configured to implement a constant threshold technique. According to this technique, DSP 226 may sample and store signal information for samples that satisfy a threshold signal amplitude. For example, DSP 226 may be configured to store signal information for samples that include a signal amplitude that is less than or equal to a first amplitude threshold (e.g., 0.08, 0.10, 0.50, etc.) or greater than or equal to a second amplitude threshold (e.g., −0.08, −0.10, −0.50 etc.). In this way, DSP 226 may determine signal information around the zero crossing (e.g., as the signal amplitude decreases from positive to negative and crosses zero, as the signal amplitude increases from negative to positive and crosses zero). Here, after detecting the zero crossing, DSP 226 may continue sampling the digital signal and storing (e.g., in a buffer memory) signal information until the appropriate amplitude threshold is satisfied. DSP 226 may then obtain the signal information from the buffer memory. The signal information, associated with the samples between the amplitude thresholds, may then be used to determine a fitted polynomial associated with the zero crossing, as described below. Notably, the quantity of samples associated with the constant threshold technique may vary for each zero crossing. Moreover, using this technique, a quantity of samples taken before the zero crossing may differ from a quantity of samples taken after the zero crossing. The constant threshold technique may be useful when a frequency of the digital signal is low such that a large number of samples may be needed to capture a trend around the zero crossing.

As further shown in FIG. 4, process 400 may include determining a fitted polynomial, associated with the zero crossing of the digital signal, based on the signal information (block 430). For example, DSP 226 may determine a fitted polynomial, associated with the zero crossing of the digital signal, based on the signal information. In some implementations, DSP 226 may determine the fitted polynomial after DSP 226 obtains the signal information. In some implementations, the fitted polynomial may include a first order polynomial, a second order polynomial, or the like. In some implementations, DSP 226 may determine the fitted polynomial based on extrapolating and/or interpolating the signal information. While implementations and examples described herein are described in the context of a first order polynomial being used to determine a zero crossing time, in other implementations and other examples, another type of polynomial may be used to determine the zero crossing time.

In one example implementation, DSP 226 may determine the fitted polynomial using Least Square Fit criteria in order to determine a slope and an intercept of the fitted polynomial. Here, the root of the fitted polynomial may provide an accurate zero crossing time. For example, assume that the signal information includes a set of signal amplitudes $y_n$ (e.g., $y_n = y_1, y_2, y_3 \ldots y_N$) and a corresponding set of timestamps $t_n$ (e.g., $t_n = t_1, t_2, t_3 \ldots t_N$). Here, the digital signal around the zero crossing may be modeled as a first order polynomial (e.g., $s_n$) given by:

$$s_n = at_n + b$$

where $n = 1, 2, 3 \ldots N$ and constants a and b are to be determined based on Least Square Fit criterion.

Here, DSP 226 may (e.g., using a Least Square Estimator (LSE)) choose a and b in order to minimize a cost function (e.g., $J(a,b)$) given by:

$$J(a, b) = \sum_{n=1}^{N} (y_n - s_n)^2$$

which may be written as:

$$J(a, b) = \sum_{n=1}^{N} (y_n - (at_n + b))^2$$

In order to minimize the cost function, a partial derivative with respect to a and b may be evaluated and set to zero. That is:

$$\frac{\partial J(a, b)}{\partial a} = 0 \Rightarrow \sum_{n=1}^{N} ((y_n - (at_n + b))(-t_n)) = 0$$

$$\frac{\partial J(a, b)}{\partial b} = 0 \Rightarrow \sum_{n=1}^{N} (y_n - (at_n + b)) = 0$$

where the two equations have two unknowns (e.g., a and b). Here, both equations may be written in matrix form as follows:

$$\begin{pmatrix} \sum_{n=1}^{N} t_n^2 & \sum_{n=1}^{N} t_n \\ \sum_{n=1}^{N} t_n & \sum_{n=1}^{N} 1 \end{pmatrix} \begin{pmatrix} a \\ b \end{pmatrix} = \begin{pmatrix} \sum_{n=1}^{N} t_n y_n \\ \sum_{n=1}^{N} y_n \end{pmatrix}$$

The solution to this equation may be given by:

$$a = \frac{N \sum_{n=1}^{N} t_n y_n - \sum_{n=1}^{N} t_n \sum_{n=1}^{N} y_n}{N^2 \left( \frac{1}{N} \sum_{n=1}^{N} t_n^2 - \bar{t}_n \right)}$$

$$b = \frac{-\sum_{n=1}^{N} t_n \sum_{n=1}^{N} t_n y_n + \sum_{n=1}^{N} t_n^2 \sum_{n=1}^{N} y_n}{N^2 \left( \frac{1}{N} \sum_{n=1}^{N} t_n^2 - \bar{t}_n \right)}$$

where $\bar{t}_n$ denotes a mean value of $t_n$. In some implementations, DSP 226 may then solve for a and b (e.g., based on the signal information) in order to determine the fitted polynomial (e.g., $s_n$).

As further shown in FIG. 4, process 400 may include determining a zero crossing time based on the fitted polynomial (block 440). For example, DSP 226 may determine a zero crossing time based on the fitted polynomial. In some implementations, DSP 226 may determine the zero crossing time after DSP 226 determines the fitted polynomial.

In some implementations, DSP 226 may determine the zero crossing time based on a root (e.g., $t_r$) of the fitted polynomial. For example, DSP 226 may determine $t_r$ by setting $s_n$ equal to zero and solving for $t_r$ (e.g., $0 = at_r + b \rightarrow t_r = -b/a$), as follows:

$$t_r = -\frac{b}{a} = \frac{\sum_{n=1}^{N} t_n \sum_{n=1}^{N} t_n y_n - \sum_{n=1}^{N} t_n^2 \sum_{n=1}^{N} y_n}{N \sum_{n=1}^{N} t_n y_n - \sum_{n=1}^{N} t_n \sum_{n=1}^{N} y_n}$$

Here, if $\bar{y}_n$ is a mean value of $y_n$, then the equation may be simplified as:

$$t_r = \frac{N \bar{t}_n \sum_{n=1}^{N} t_n y_n - N \bar{y}_n \sum_{n=1}^{N} t_n^2}{N \sum_{n=1}^{N} t_n y_n - N^2 \bar{t}_n \bar{y}_n}$$

which may be simplified as:

$$t_r = \frac{\bar{t}_n \sum_{n=1}^{N} t_n y_n - \bar{y}_n \sum_{n=1}^{N} t_n^2}{\sum_{n=1}^{N} t_n y_n - N\bar{t}_n\bar{y}_n}$$

Figure 6:
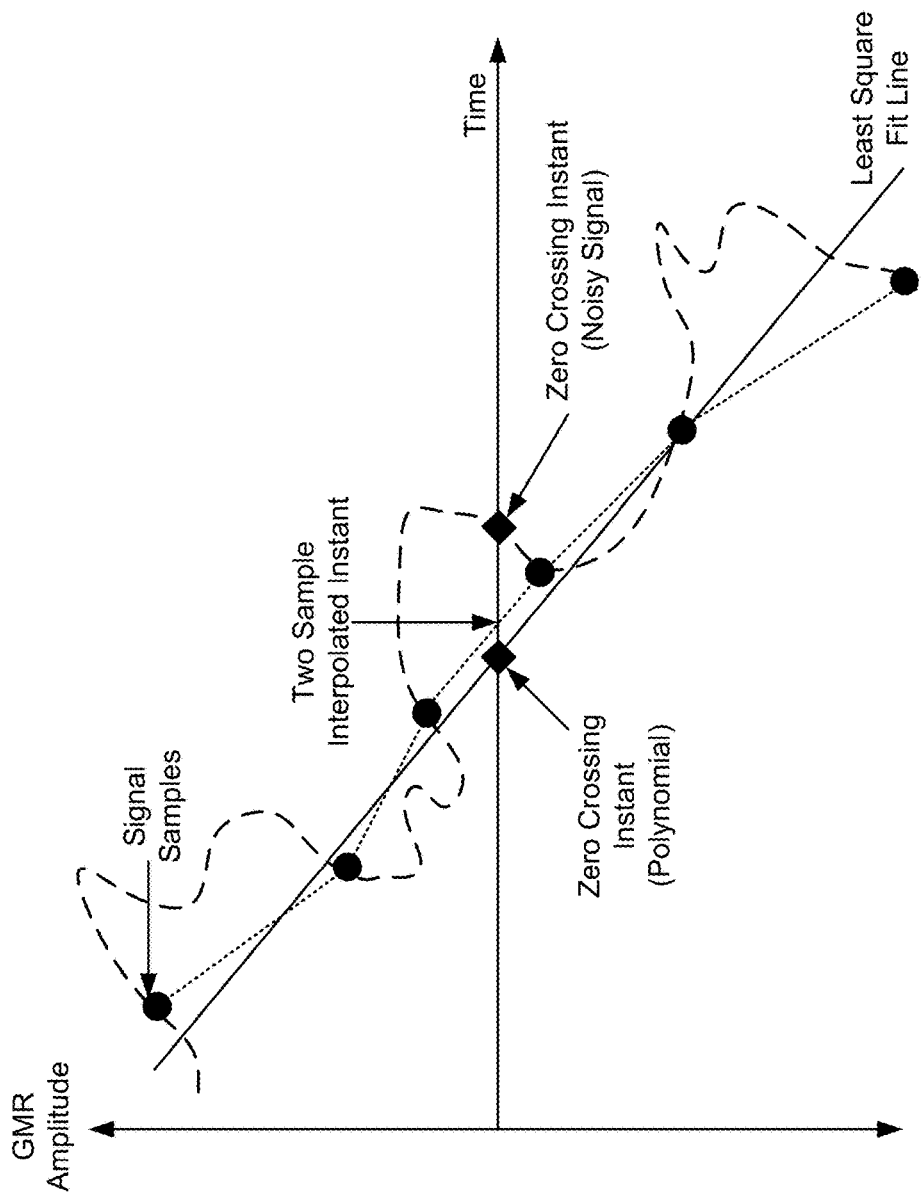
FIG. 6 is a diagram that shows an example of how a zero crossing time, determined using a fitted polynomial for a noisy signal, may differ from a zero crossing time associated with the noisy signal itself.

From this equation, it may be concluded that if a mean value of $y_n$ is zero (i.e., if the signal amplitudes are symmetric around the zero crossing), then the zero crossing will be equal to the mean value of to (i.e., if $\bar{y}_n=0$, then $t_r=\bar{t}_n$). For mean values of $y_n$ other than zero, $t_r$ is not equal to $\bar{t}_n$. This equation may be used to determine an accurate zero crossing time without any matrix inversion. Moreover, this equation simplifies calculation of the zero crossing time and there may be relatively few terms to handle (e.g., as compared to a solution of a matrix equation). FIG. 6 is a diagram that shows an example of how a zero crossing time, determined using a fitted polynomial for a noisy signal, may differ from a zero crossing time associated with the noisy signal itself.

In some implementations, DSP 226 may repeat process 400 in order to determine times for a set of zero crossings associated with a particular period of time. For example, DSP 226 may be configured to determine times of zero crossings in successive intervals of time (e.g., one minute intervals, two minute intervals, etc.).

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

Figure 7:
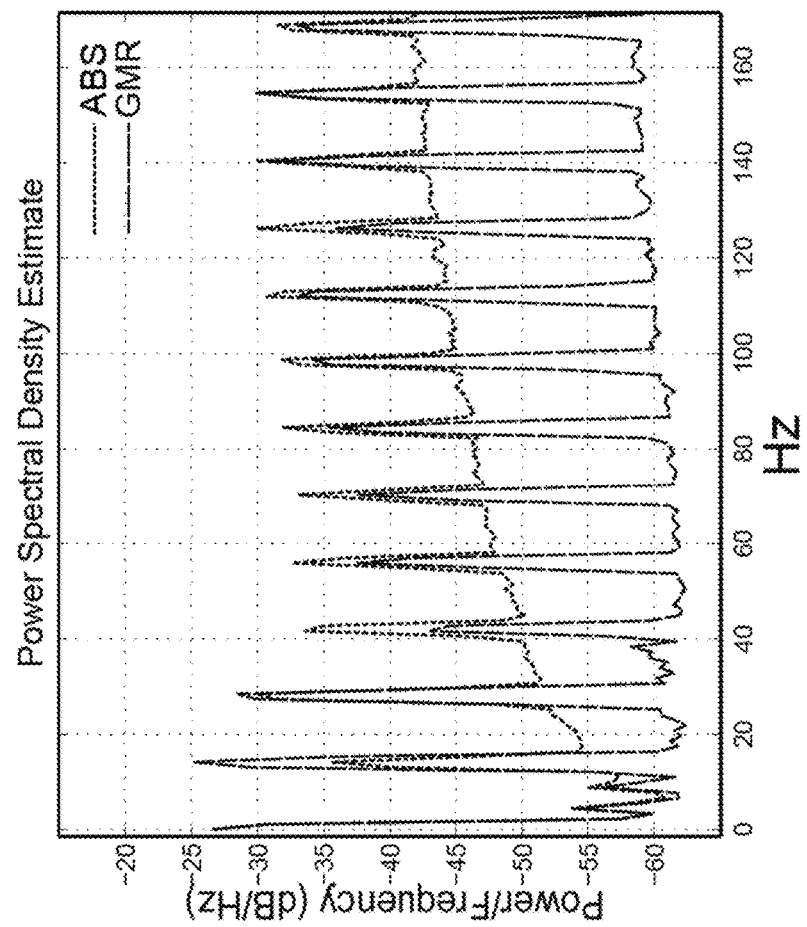
FIG. 7 is a diagram that shows an example of a speed spectrum generated using a giant magnetoresistance (GMR) sensor signal, as compared to a speed spectrum generated using an ABS sensor signal.

In the case of an ITPMS, DSP 226 may then generate a speed signal for each interval of time (e.g., based on the set of zero crossing times) and a corresponding speed spectrum. The speed spectrum generated based on the accurate zero crossing times may have a lower noise floor than a noise floor of a speed spectrum generated using the traditional method described above. FIG. 7 is a diagram that shows an example of a speed spectrum generated using a GMR sensor signal (i.e., in the manner described above), as compared to a speed spectrum generated using an ABS sensor signal (e.g., the traditional method). As shown in FIG. 7, the speed spectrum of the GMR sensor signal has a lower noise floor than the speed spectrum of the ABS sensor signal.

Figure 8:
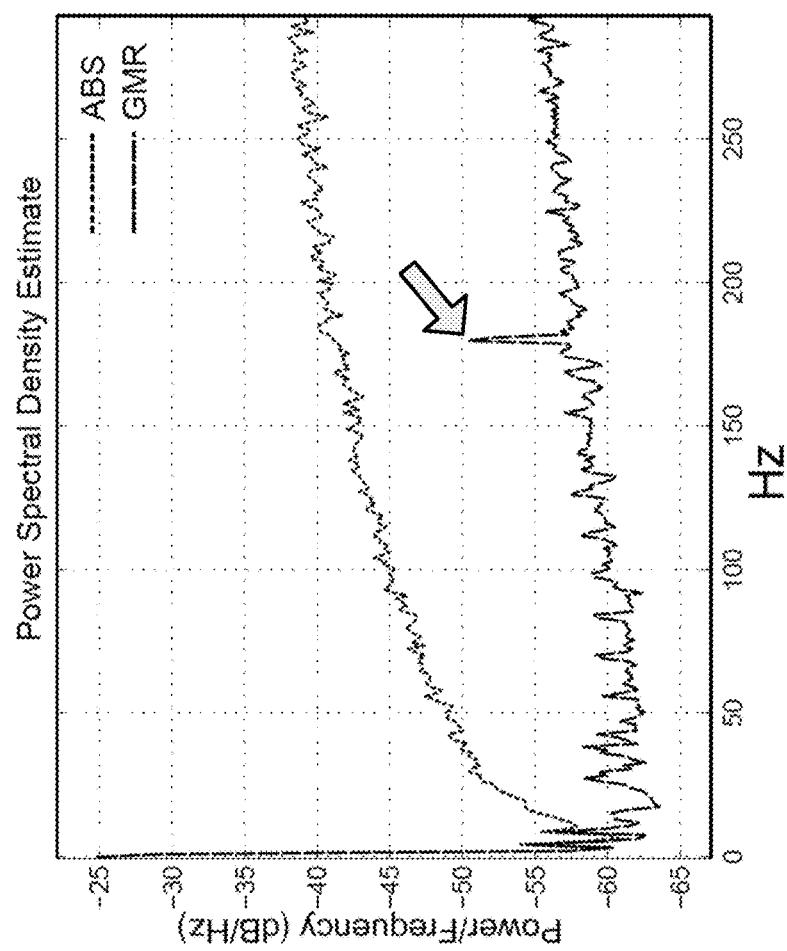
FIG. 8 is a diagram that shows an example of a speed spectrum generated using a GMR sensor signal after pattern removal as compared to a speed spectrum generated using an ABS sensor signal after pattern removal.

In some implementations, DSP 226 may also perform pattern removal in order to identify vibration information for use in an ITPMS. FIG. 8 is a diagram that shows an example of a speed spectrum generated using a GMR sensor signal after pattern removal as compared to a speed spectrum generated using an ABS sensor signal after pattern removal. As shown in FIG. 8, due to the lower noise floor of the speed spectrum of the GMR sensor signal, vibration information may be readily identifiable. For example, as indicated by an arrow in FIG. 8, DSP 226 may determine (e.g., based on a frequency peak after pattern removal), vibration information indicating that vibrations are present at a frequency of approximately 170 Hz. As shown, the vibration information is not identifiable within the speed spectrum of the ABS sensor signal due to the high noise floor.

In some implementations, for use in an ITPMS, DSP 226 and/or ECU 230 may track the vibration information for successive periods of time (e.g., for successive one minute intervals, for successive two minute intervals, etc.), and changes in the vibration information (e.g., an increase in the frequency peak, a decrease in the frequency peak) may be used to identify changes in tire pressure in an ITPMS.

Implementations described herein may allow a digital signal processor to determine zero crossing times, associated with a digital signal corresponding to a magnetic field, based on fitting a polynomial at the zero crossing. The zero crossing times may then be used to determine a speed spectrum with a low noise floor that allows other useful information (e.g., vibration information) to be identified and/or further analyzed (e.g., for use in an ITPMS).

The foregoing disclosure provides illustration and description, but is not intended to be exhaustive or to limit the implementations to the precise form disclosed. Modifications and variations are possible in light of the above disclosure or may be acquired from practice of the implementations.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, etc.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the terms "group" and "set" are intended to include one or more items (e.g., related items, unrelated items, a combination of related items and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A device, comprising:
   a sensor; and
   a digital component configured to:
   detect a zero crossing of a digital signal;
   obtain signal information associated with the zero crossing;
   determine, based on the signal information, a fitted polynomial associated with the zero crossing;
   determine, based on the fitted polynomial, a zero crossing time;
   generate, based on the zero crossing time, a speed signal; and
   determine vibration information based on removing a pattern from the speed signal,
   a speed spectrum, after the pattern is removed, having a noise floor at a level that allows the vibration information to be determined, and the vibration information being determined based on a frequency peak, of the speed spectrum, after the pattern is removed.

2. The device of claim 1, where the digital component is further configured to:
sample the digital signal; and
where the digital component, when detecting the zero crossing of the digital signal, is configured to:
detect the zero crossing of the digital signal based on sampling the digital signal.

3. The device of claim 2, where the digital component is further configured to:
store a particular quantity of successive samples based on sampling the digital signal.

4. The device of claim 1, where the signal information is first signal information; and
where the digital component, when detecting the zero crossing of the digital signal, is configured to:
detect the zero crossing of the digital signal based on:
second signal information, associated with a first sample of the digital signal taken before the zero crossing, including a positive signal amplitude value, and
third signal information, associated with a second sample of the digital signal taken after the zero crossing, including a negative signal amplitude value.

5. The device of claim 1, where the signal information is first signal information; and
where the digital component, when detecting the zero crossing of the digital signal, is configured to:
detect the zero crossing of the digital signal based on:
second signal information, associated with a first sample of the digital signal taken before the zero crossing, including a negative signal amplitude value, and
third signal information, associated with a second sample of the digital signal taken after the zero crossing, including a positive signal amplitude value.

6. The device of claim 1, where the digital component, when obtaining the signal information associated with the zero crossing, is configured to:
sample the digital signal to obtain:
one or more samples of the digital signal before the zero crossing, and
one or more samples of the digital signal after the zero crossing.

7. The device of claim 1, where the digital component, when obtaining the signal information associated with the zero crossing, is configured to:
obtain the signal information associated with the zero crossing until a sample of the digital signal that satisfies an amplitude threshold is identified.

8. A method, comprising:
detecting, by a device, a zero crossing of a digital signal;
obtaining, by the device, signal information associated with the zero crossing;
determining, by the device, based on the signal information, a fitted polynomial associated with the zero crossing;
determining, by the device, based on the fitted polynomial, a zero crossing time;
generating, by the device, based on the zero crossing time, a speed signal; and
determining, by the device, vibration information based on removing a pattern from the speed signal,
a speed spectrum, the pattern is removed, having a noise floor at a level that allows the vibration information to be determined, and
the vibration information being determined based on a frequency peak, of the speed spectrum, the pattern is removed.

9. The method of claim 8, further comprising:
tracking the vibration information for a particular period of time.

10. The method of claim 8, further comprising:
determining changes in the vibration information based on tracking the vibration information; and
associating the changes in the vibration information with changes in tire pressure.

11. The method of claim 8, where obtaining the signal information associated with the zero crossing comprises:
obtaining first signal information that is associated with the digital signal before the zero crossing and second signal information that is associated with the digital signal after the zero crossing.

12. The method of claim 8, where the signal information includes:
one or more signal amplitudes associated with the digital signal, and
one or more timestamps corresponding to the one or more signal amplitudes.

13. The method of claim 8, where detecting the zero crossing of the digital signal comprises:
detecting the zero crossing of the digital signal based on an amplitude, associated with a sample of the digital signal, being equal to zero.

14. The method of claim 8, where obtaining the signal information associated with the zero crossing comprises:
obtaining the signal information associated with the zero crossing until a sample of the digital signal that satisfies an amplitude threshold is identified.

15. A non-transitory computer-readable medium storing instructions, the instructions comprising:
one or more instructions that, when executed by one or more processors, cause the one or more processors to:
detect a zero crossing of a digital signal;
obtain signal information associated with the zero crossing;
determine, based on the signal information, a fitted polynomial associated with the zero crossing;
determine, based on the fitted polynomial, a zero crossing time;
generate, based on the zero crossing time, a speed signal; and
determine vibration information based on removing a pattern from the speed signal,
a speed spectrum, after the pattern is removed, having a noise floor at a level that allows the vibration information to be determined, and
the vibration information being determined based on a frequency peak, of the speed spectrum, after the pattern is removed.

16. The non-transitory computer-readable medium of claim 15, where the one or more instructions, when executed by the one or more processors, further cause the one or more processors to:
track the vibration information for a period of time;
determine changes in the vibration information based on tracking the vibration information; and
associate the changes in the vibration information with changes in tire pressure.

17. The non-transitory computer-readable medium of claim 15, where the signal information is first signal information; and
 where the one or more instructions, that cause the one or more processors to detect the zero crossing of the digital signal, cause the one or more processors to:
  detect the zero crossing of the digital signal based on:
   second signal information, associated with a first sample of the digital signal taken before the zero crossing, including a positive signal amplitude value, and
   third signal information, associated with a second sample of the digital signal taken after the zero crossing, including a negative signal amplitude value.

18. The non-transitory computer-readable medium of claim 15, where the signal information is first signal information; and
 where the one or more instructions, that cause the one or more processors to detect the zero crossing of the digital signal, cause the one or more processors to:
  detect the zero crossing of the digital signal based on:
   second signal information, associated with a first sample of the digital signal taken before the zero crossing, including a negative signal amplitude value, and
   third signal information, associated with a second sample of the digital signal taken after the zero crossing, including a positive signal amplitude value.

19. The non-transitory computer-readable medium of claim 15, where the one or more instructions, that cause the one or more processors to obtain the signal information associated with the zero crossing, cause the one or more processors to:
 obtain the signal information associated with the zero crossing until a sample of the digital signal that satisfies an amplitude threshold is identified.

20. The non-transitory computer-readable medium of claim 15, where the one or more instructions, that cause the one or more processors to obtain the signal information associated with the zero crossing, cause the one or more processors to:
 obtain first signal information that is associated with the digital signal before the zero crossing and second signal information that is associated with the digital signal after the zero crossing.

\* \* \* \* \*